United States Patent
Matsui et al.

(10) Patent No.: US 8,330,181 B2
(45) Date of Patent: Dec. 11, 2012

(54) SEMICONDUCTOR LIGHT-EMITTING DEVICE

(75) Inventors: Nobuaki Matsui, Kyoto (JP); Atsushi Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/452,059

(22) PCT Filed: May 14, 2008

(86) PCT No.: PCT/JP2008/058845
§ 371 (c)(1),
(2), (4) Date: Dec. 14, 2009

(87) PCT Pub. No.: WO2008/155960
PCT Pub. Date: Dec. 24, 2008

(65) Prior Publication Data
US 2010/0102342 A1   Apr. 29, 2010

(30) Foreign Application Priority Data

Jun. 15, 2007 (JP) ................. 2007-158951
Jun. 15, 2007 (JP) ................. 2007-158955
Sep. 12, 2007 (JP) ................. 2007-236755

(51) Int. Cl.
*H01L 33/00* (2010.01)
(52) U.S. Cl. ................. 257/99; 257/E33.067
(58) Field of Classification Search .......... 257/79, 257/98, 99, E33.067, E33.072
See application file for complete search history.

(56) References Cited

U.S. PATENT DOCUMENTS
2004/0056254 A1* 3/2004 Bader et al. ........... 257/79
2007/0058059 A1 3/2007 Suehiro
2007/0080353 A1* 4/2007 Lee et al. ............... 257/79
2007/0116423 A1* 5/2007 Leatherdale et al. .... 385/146

FOREIGN PATENT DOCUMENTS
| JP | 07-263754 A | 10/1995 |
| JP | 2003-224297 A | 8/2003 |
| JP | 2005-197289 A | 7/2005 |
| JP | 2006-120913 A | 5/2006 |
| JP | 2007-103917 A | 4/2007 |
| JP | 2007-123731 A | 5/2007 |
| WO | WO-2006/011458 A1 | 2/2006 |

* cited by examiner

*Primary Examiner* — Tucker Wright
(74) *Attorney, Agent, or Firm* — Rabin & Berdo, P.C.

(57) ABSTRACT

A semiconductor light-emitting device capable of increasing an amount of light irradiated to the outside is provided.

A semiconductor light-emitting device (1) includes a substrate (2), an n-type semiconductor layer (3), a light-emitting layer (4), a p-type semiconductor layer (5), an n-side pad electrode (6), an n-side pad electrode (7), a p-side electrode (8), a reflecting layer (9), and a p-side pad electrode (10). The n-side pad electrode (7) is electrically connected to the n-type semiconductor layer (3) via the n-side pad electrode (6). The p-side pad electrode (10) is electrically connected to the p-type semiconductor layer (5) via the p-side electrode (8). A connection surface (7a) of the n-side pad electrode (7) connected to the n-type semiconductor layer (3) is arranged in a first area (Ar1) closer to a short side (2b) on an arrow B direction-side, and a connection surface (10a) of the p-side pad electrode (10) connected to the p-type semiconductor layer (5) is arranged in a fourth area (Ar4) closest to a short side (2b) on an arrow A direction-side among the first area (Ar1) to the fourth area (Ar4) formed by equally dividing the substrate (2) into four.

19 Claims, 8 Drawing Sheets

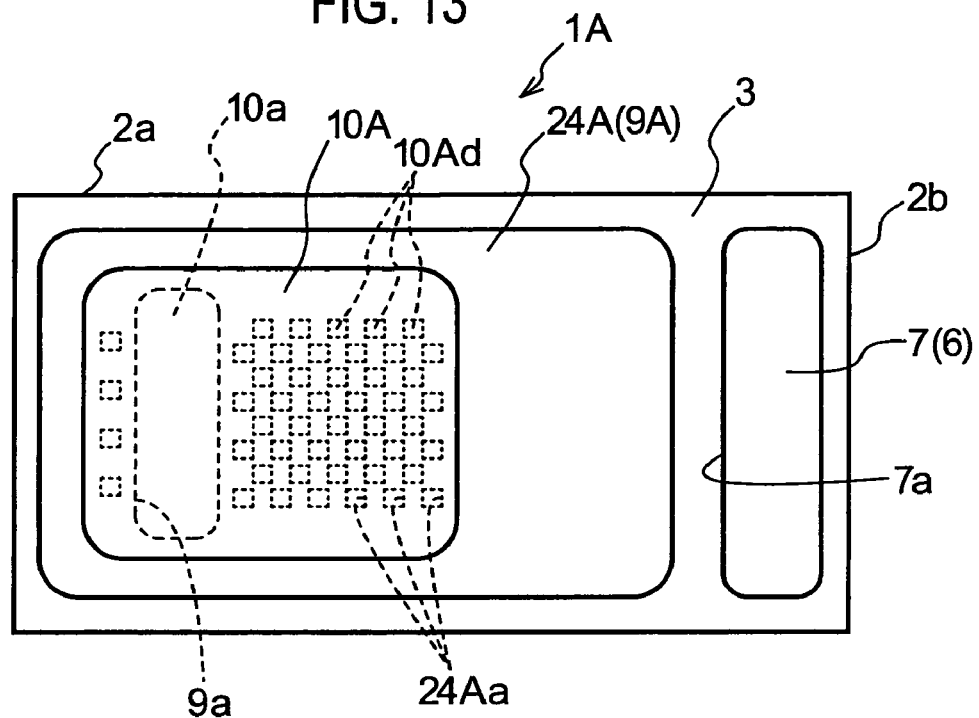
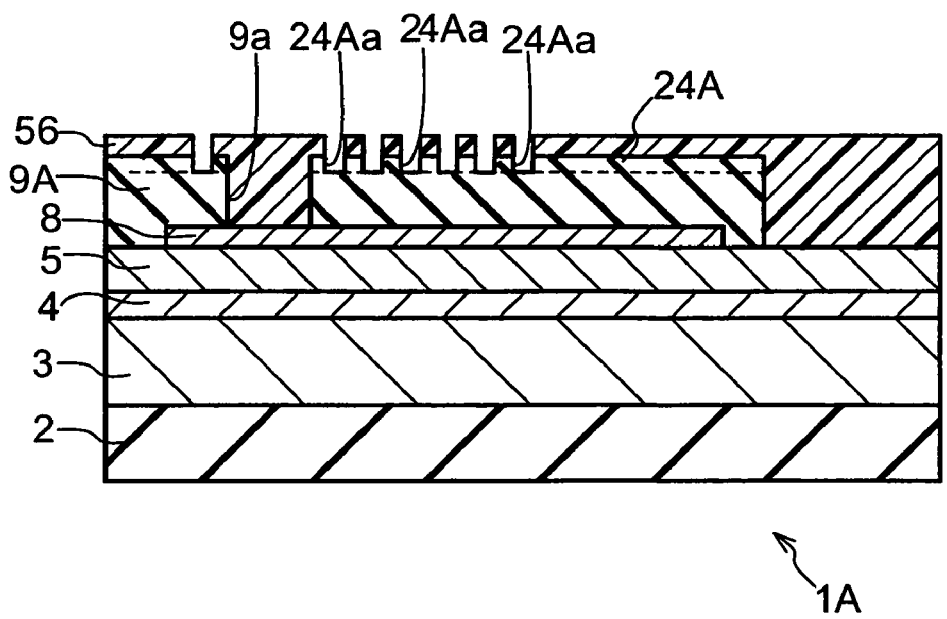

SEMICONDUCTOR LIGHT-EMITTING DEVICE

TECHNICAL FIELD

The present invention relates to a semiconductor light-emitting device having a pair of pad electrodes provided on the same side. The present invention also relates to a semiconductor light-emitting device including a GaN-based semiconductor.

BACKGROUND ART

There is conventionally known a semiconductor light-emitting device having a pair of pad electrodes provided on the same side. For example, Patent Document 1 discloses a semiconductor light-emitting device having a pair of pad electrodes provided on an upper surface of a rectangular semiconductor light-emitting device in a plan view. One of the pad electrodes of this semiconductor light-emitting device is provided near one short side of the semiconductor light-emitting device. The other pad electrode is located near the other short side thereof and formed to occupy about two-thirds of the upper surface of the semiconductor light-emitting device.

In this semiconductor light-emitting device, when a voltage is applied between the paired pad electrodes, electrons and holes are injected into a semiconductor layer via the both pad electrodes. The injected electrons and holes recombine in the semiconductor layer, thereby emitting light.

Furthermore, there is conventionally known a semiconductor light-emitting device including a semiconductor layer made of a GaN-based semiconductor and a reflecting layer for reflecting light from a light-emitting layer.

For example, Patent Document 2 discloses a semiconductor light-emitting device including an n-type semiconductor layer, a light-emitting layer, a p-side electrode, an insulating film, a reflecting layer, a p-side pad electrode, and an n-side electrode, and made of a GaN-based semiconductor. The p-side electrode is constituted by a laminated metal structure thin enough to be able to transmit light, and is formed on the p-type semiconductor layer in a state of being ohmic-connected to the p-type semiconductor layer. The insulating film is formed onto the p-side electrode in a state of being partially opened so as to expose a part of the p-side electrode. The reflecting layer is formed on the insulating film in a state of being connected to an exposed portion of the p-side electrode. The p-side pad electrode is formed on a part of the reflecting layer.

In the semiconductor light-emitting device of Patent Document 2, when a forward voltage is applied, electrons are then injected into the n-side electrode and holes are injected into the p-side pad electrode. The injected electrons are injected into the light-emitting layer via the n-type semiconductor layer. The injected holes are injected into the light-emitting layer via the reflecting layer, the p-side electrode, and the p-type semiconductor layer. The electrons and holes injected into the light-emitting layer recombine, thereby emitting blue or green light. Out of the emitted light, the light traveling in a direction of the p-side electrode transmits through the p-side electrode and the insulating film, and then reaches the reflecting layer. The light is reflected by the reflecting layer, changes the traveling direction, again transmits through the p-side electrode and the insulating film, and is irradiated to the outside.

[Patent Document 1] Japanese Patent Application Laid-open No. H7-263754

[Patent Document 2] Japanese Patent Application Laid-open No. 2003-224297

DISCLOSURE OF THE INVENTION

Problems to be Solved by the Invention

However, the above semiconductor light-emitting device described in Patent Document 1 has the following problems. Because the other pad electrode occupies about two-thirds of the upper surface of the semiconductor light-emitting device, a path of current flowing between the paired pad electrodes is small, a region of the semiconductor layer that contributes to light emission is small, and the amount of light irradiated to the outside is small.

Furthermore, the above semiconductor light-emitting device described in Patent Document 2 has the following problems. Because the p-side electrode is made of laminated metal ohmic-connected to the p-type semiconductor layer, the light is absorbed by an interface between the p-side electrode and the p-type semiconductor layer when the light is incident on the p-side electrode. Moreover, after being reflected by the reflecting layer, the light transmits through the interface between the p-side electrode and the p-type semiconductor layer, and thus the light is further absorbed. Therefore, the amount of the light absorbed within the semiconductor light-emitting device is large and efficiency for extracting the light to the outside is low.

The present invention has been contrived to solve the above problems, and an object of the present invention is to provide a semiconductor light-emitting device capable of increasing the amount of light irradiated to the outside.

Furthermore, the present invention has been contrived to solve the above problems, and an object of the present invention is to provide a semiconductor light-emitting device capable of improving light extraction efficiency.

Means for Solving the Problems

To achieve the objects, the invention according to claim 1 is a semiconductor light-emitting device including: a substrate having a rectangular shape in a plan view; a semiconductor layer including a first conduction-type semiconductor layer, a light-emitting layer, and a second conduction-type semiconductor layer, and formed on the substrate; a first pad electrode electrically connected to an upper surface of the first conduction-type semiconductor layer; and a second pad electrode electrically connected to an upper surface of the second conduction-type semiconductor layer, wherein a first connection surface of the first pad electrode, the first connection surface being a surface connected to the first conduction-type semiconductor layer, is formed on an opposite side to a second connection surface of the second pad electrode, the second connection surface being a surface connected to the second conduction-type semiconductor layer, across a center line of the substrate, the center line being parallel to short sides of the substrate in a plan view.

Note that the connection surface of each pad electrode connected to each semiconductor layer is a concept involving not only a surface directly connected to a semiconductor layer but also a surface indirectly connected thereto via a metal electrode, a transparent electrode or the like.

The invention according to in claim 2 is according to claim 1, wherein a height from an upper surface of the substrate to an upper surface of the first pad electrode is equal to a height from the upper surface of the substrate to an upper surface of the second pad electrode.

The invention according to in claim 3 is according to claim 1, wherein the connection surface of the first pad electrode and the connection surface of the second pad electrode are rectangular long in a direction of the short side of the substrate in a plan view.

The invention according to in claim 4 is according to claim 1, wherein one side of the first connection surface on the second pad electrode-side is parallel to one side of the second connection surface on a the first pad electrode-side.

The invention according to in claim 5 is according to claim 1, wherein, among a first region to a fourth region formed by equally dividing the substrate along a long side direction, the first connection surface is located in the first region closest to one of the short sides of the substrate and the second connection surface is located in the fourth region closest to the other short side of the substrate.

The invention according to in claim 6 is according to claim 1, wherein a length of each of long sides of the substrate is 1.7 to 2.3 times as large as a length of each of the short sides of the substrate.

The invention according to in claim 7 is according to claim 1 including: a transparent electrode formed on the second conduction-type semiconductor layer and made of a conductive oxide; and a reflecting layer including a dielectric multi-layer film formed on the transparent electrode so as to expose a part of the transparent electrode, wherein the first conduction-type semiconductor layer is formed on the substrate, the light-emitting layer is formed on the first conduction-type semiconductor layer, the second conduction-type semiconductor layer is formed on the light-emitting layer, and the second pad electrode is formed on the reflecting layer while being electrically connected to a part of the transparent electrode.

The invention according to in claim 8 is according to claim 7, wherein a concave portion is formed in an uppermost layer in the reflecting layer, and a part of the second pad electrode is buried in the concave portion.

The invention according to in claim 9 is according to claim 7, wherein the reflecting layer is formed to cover a side surface of the transparent electrode.

The invention according to in claim 10 is according to claim 7, wherein the substrate can transmit light from the light-emitting layer.

To achieve the above objects, the invention according to claim 11 is a semiconductor light-emitting device including: a semiconductor layer including a first conduction-type semiconductor layer formed on the substrate, a light-emitting layer formed on the first conduction-type semiconductor layer and made of a GaN-based semiconductor, and a second conduction-type semiconductor layer formed on the light-emitting layer; a transparent electrode formed on the second conduction-type semiconductor layer, and made of a conductive oxide; a reflecting layer including a dielectric multilayer film formed on the transparent electrode so as to expose a part of the transparent electrode; and an electrode formed on the reflecting layer while being electrically connected to a part of the transparent electrode.

Note that "Being formed on—" is a concept involving not only being formed on—directly but also being formed on—via other layers indirectly. For example, "Being formed on the substrate" is a concept involving being formed on the substrate via the buffer layer.

The invention according to in claim 12 is according to claim 11, wherein a concave portion is formed in an uppermost layer in the reflecting layer, and a part of the electrode is buried in the concave portion.

The invention according to in claim 13 is according to claim 11, wherein the reflecting layer is formed to cover a side surface of the transparent electrode.

The invention according to in claim 14 is according to claim 11, wherein the substrate can transmit light from the light-emitting layer.

Effects of the Invention

According to the present invention, since the first connection surface is formed on the opposite side to the second connection surface across the center line of the substrate, it is possible to make a path of current flowing between the first pad electrode and the second pad electrode wide. Since it is thereby possible to make a region of the light-emitting layer contributing to light emission large, the amount of light irradiated to the outside can be increased.

Moreover, according to the present invention, the transparent electrode made of an oxide is formed between the second conduction-type semiconductor layer and the reflecting layer. Accordingly, the light emitted from the light-emitting layer, transmitting through the second conduction-type semiconductor layer, and reaching the transparent electrode is hardly absorbed but reaches the reflecting layer. Since a large amount of light can be thereby reflected by the reflecting layer and irradiated to the outside, light extraction efficiency can be improved.

BRIEF DESCRIPTION OF THE DRAWINGS

FIG. 13 A plan view of the semiconductor light-emitting device according to the second embodiment.

FIG. 14 A cross-sectional view for explaining steps of manufacturing the semiconductor light-emitting device according to the second embodiment.

Figure 1:
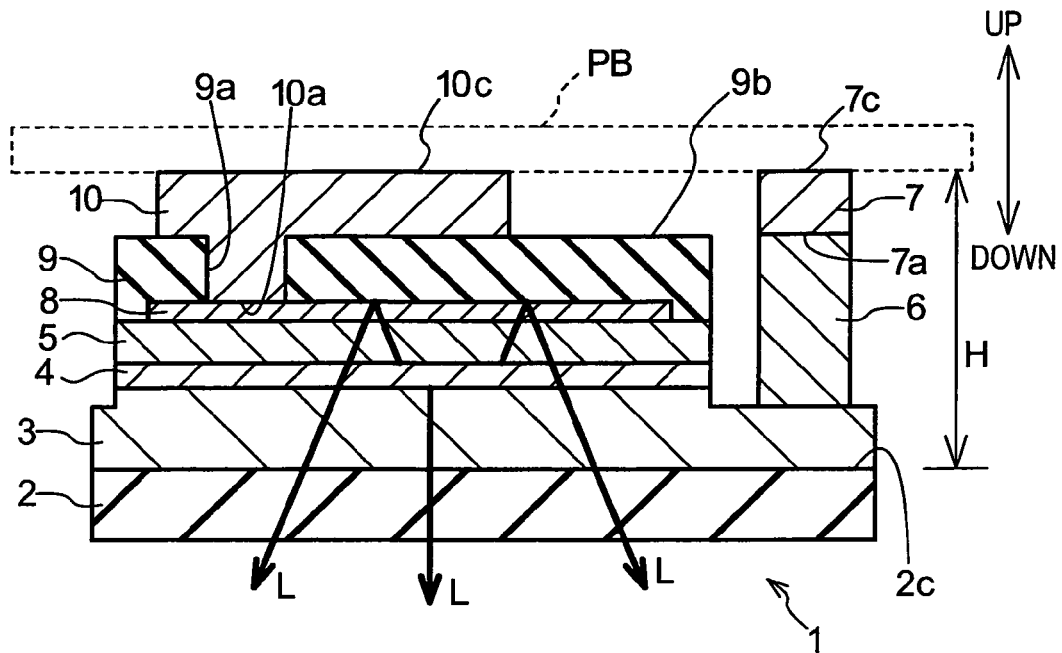
FIG. 1 A cross-sectional view of a semiconductor light-emitting device according to a first embodiment of the present invention.

EXPLANATIONS OF REFERENCE NUMERALS 1, 1A, 1B Semiconductor light-emitting device
2 Substrate
2a Long side
2b Short side 2c Upper surface
3 n-type semiconductor layer
4 Light-emitting layer
5 p-type semiconductor layer
6 n-side electrode
7 n-side pad electrode
7a Connection surface
7b One side
7c Upper surface
9 p-side electrode
9, 9A, 9B Reflecting layer
9a Opening
9b Upper surface
10, 10A, 10B p-side pad electrode
10a Connection surface
10b One side
10c Upper surface
10Ad, 10Bd Part
21 Well layer
22 Barrier layer
23 First dielectric layer
24, 24A, 24B Second dielectric layer
24Aa, 24Ba Concave portion
31 Al/Ni film
33 Ti/Au and Au/Sn film
51 to 56 Resist film
Ar1 to Ar4 Area
PB Printed board

BEST MODE FOR CARRYING OUT THE INVENTION

Figure 2:
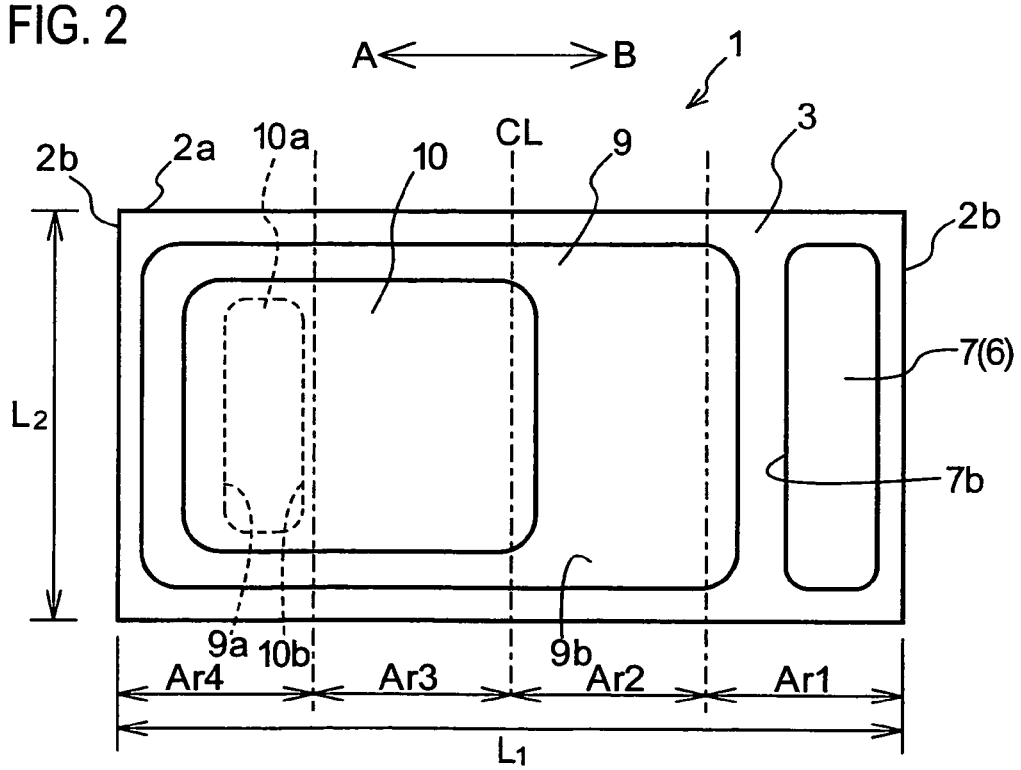
FIG. 2 A plan view of the semiconductor light-emitting device according to the first embodiment.
Figure 3:
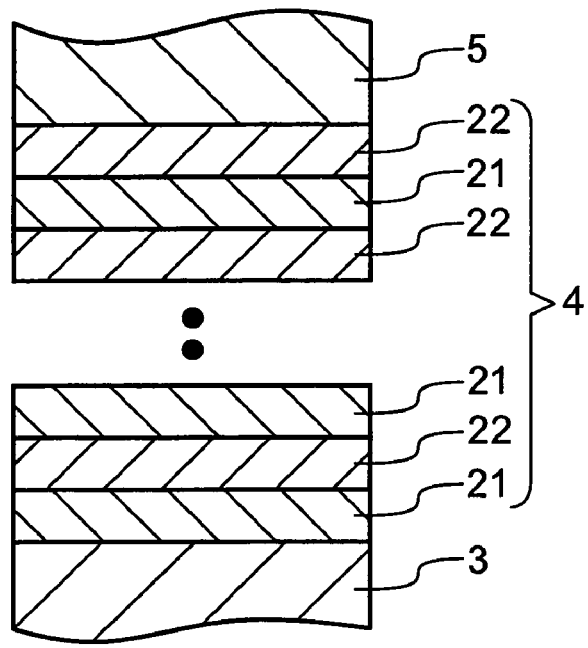
FIG. 3 A cross-sectional view of a light-emitting layer.
Figure 4:
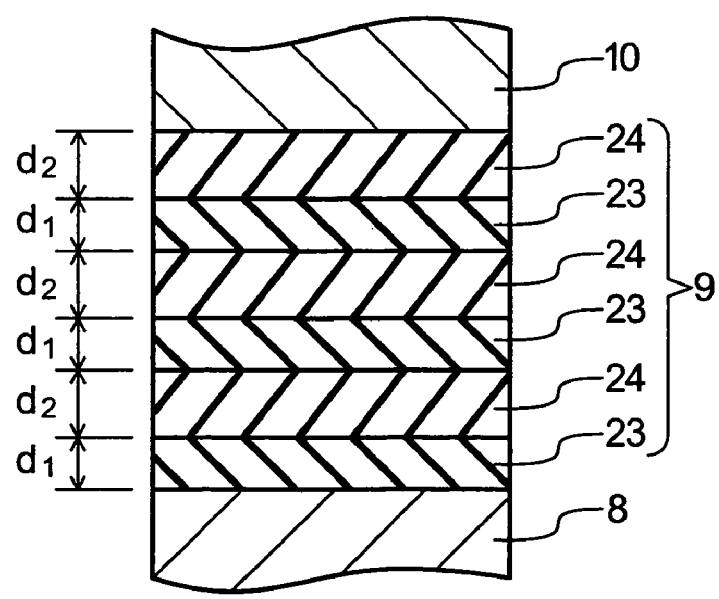
FIG. 4 A cross-sectional view of a reflecting layer.

A semiconductor light-emitting device according to a first embodiment of the present invention is explained below with reference to the drawings. FIG. 1 is a cross-sectional view of the semiconductor light-emitting device according to the first embodiment of the present invention. FIG. 2 is a plan view of the semiconductor light-emitting device. FIG. 3 is a cross-sectional view of a light-emitting layer. FIG. 4 is a cross-sectional view of a reflecting layer. In the following descriptions, it is assumed that a printed board PB-side is an upper direction and that a substrate 2-side is a lower direction. It is assumed that light is extracted to the lower direction. It is also assumed that a plan view is a view showing the semiconductor light-emitting device from top down.

As shown in FIGS. 1 and 2, a semiconductor light-emitting device 1 includes a substrate 2, an n-type semiconductor layer (corresponding to a first conduction-type semiconductor layer in the claims) 3, a light-emitting layer 4, a p-type semiconductor layer (corresponding to a second conduction-type semiconductor layer) 5, an n-side electrode 6, an n-side pad electrode (corresponding to a first pad electrode in claim 1) 7, a p-side electrode (corresponding to a transparent electrode in the claims) 8, a reflecting layer 9, and a p-side pad electrode (corresponding to a second pad electrode in claim 1 and an electrode in claim 11) 10. The n-type semiconductor layer 3, the light-emitting layer 4, and the p-type semiconductor layer 5 correspond to semiconductor layers described in the claims. Note that a resin protection member (not shown) is provided between a printed board PB and the semiconductor light-emitting device 1 so as to surround the semiconductor light-emitting device 1.

The substrate 2 is constituted by a sapphire ($Al_2O_3$) substrate that can transmit light emitted from the light-emitting layer 4. As shown in FIG. 2, the substrate 2 is formed into a rectangular shape in a plan view as represented as follows, while assuming that a length of each long side 2a is $L_1$ and that of each short side 2b is $L_2$.

$$L_1 = a \times L_2 (a = 2.0 \pm 0.3)$$

The substrate 2 is constituted to satisfy, as an example of the length of the long side 2a and that of the short side 2b, $L_1$=170 µm±10 µm and $L_2$=90 µm±10 µm, or to be specific, $L_1$=180 µm and $L_2$=100 µm.

The n-type semiconductor layer 3 injects electrons into the light-emitting layer 4 and formed on the substrate 2. The n-type semiconductor layer 3 is made of n-type GaN having a thickness of about 4 µm and doped with Si having a concentration of about $3 \times 10^{18}$ cm$^{-3}$.

The light-emitting layer 4 emits blue light and formed on the n-type semiconductor layer 3. As shown in FIG. 3, the light-emitting layer 4 has an MQW (Multi Quantum Well) structure which has a thickness of 50 nm about to about 250 nm and in which a plurality of well layers 21 each made of $In_xGa_{1-x}N$ ($0.5 \leqq X \leqq 0.2$) having a thickness of about 2 nm to about 3 nm and a plurality of barrier layers 22 each made of GaN having a thickness smaller than about 20 nm are alternately stacked.

The p-type semiconductor layer 5 injects holes into the light-emitting layer 4 and formed on the light-emitting layer 4. The p-type semiconductor layer 5 is made of p-type GaN having a thickness of about 200 nm and doped with Mg having a concentration of about $3 \times 10^{19}$ cm$^{-3}$.

The n-side electrode 6 is made of Al/Ni formed on the n-type semiconductor layer 3 and having a thickness of about 500 nm to about 3000 nm. The n-side electrode 6 is ohmic-connected to an upper surface of the n-type semiconductor layer 3. The n-side electrode 6 is arranged near the short side 2b on an arrow B direction-side and formed into a rectangular shape extending along the short side 2b of the substrate 2 in a plan view. The n-side electrode 6, the light-emitting layer 4, and the n-type semiconductor layer 5 are formed to be away from one another at a predetermined interval.

The n-side pad electrode 7 electrically connects a wiring (not shown) formed on the printed board PB to the n-side electrode 6. Further, the n-side pad electrode 7 is electrically connected to the upper surface of the n-type semiconductor layer 3 via the n-side electrode 6. The n-side pad electrode 7 is formed on the n-side electrode 6 and formed into a rectangular shape identical to that of the n-side electrode 6 in a plan view. The n-side pad electrode 7 has a metal laminated structure of Ti/Au and Au/Sn having a thickness of about 500 nm to about 3000 nm.

A connection surface (corresponding to a first connection surface in claim 1) 7a that is a lower surface of the n-side pad electrode 7 is electrically connected to the n-type semiconductor layer 3 via the n-side electrode 6. The connection surface 7a of the n-side pad electrode 7 is formed into a rectangular shape extending along the short side 2b of the substrate 2 in a plan view. The connection surface 7a of the n-side pad electrode 7 is formed to be arranged in a first area Ar1 closest to the short side 2b on the arrow B direction-side among the first area Ar1 to a fourth area Ar4 formed by dividing the substrate 2 into four along a direction of the long sides 2a.

The p-side electrode 8 is formed on the p-type semiconductor layer 5 and electrically connected to the p-type semiconductor layer 5. The p-side electrode 8 has a thickness of about 50 nm to about 1000 nm and is made of light-transmittable and conductive ZnO.

The reflecting layer 9 reflects a light L traveling toward the p-side electrode 8 among the lights L reflected from the light-emitting layer 4. The reflecting layer 9 is formed to cover an upper surface and a side surface of the p-side electrode 8. A rectangular opening 9a is formed in the reflecting layer 9 so as to expose a part of an upper surface of the p-side electrode 8. As shown in FIG. 4, the reflecting layer 9 has a DBR (distributed Bragg reflector)-type structure constituted by a dielectric multilayer film in which first dielectric layers 23 and second dielectric layers 24 are alternately stacked. When it is assumed that a refractive index of each of the first dielectric layers 23 is $n_1$, a refractive index of each of the second dielectric layers 24 is $n_2$, and a wavelength of the light emitted from the light-emitting layer 4 is λ, the first dielectric layer 23 and the second dielectric layer 24 are formed to have thicknesses $d_1$ and $d_2$ satisfying the following equations, respectively.

$$d_1 = \lambda/(4n_1) \tag{1}$$

$$d_2 = \lambda/(4n_2) \tag{2}$$

By way of example, when the first dielectric layer 23 is constituted by $ZrO_2$ ($n_1$=2.12), the second dielectric layer 24 is constituted by $SiO_2$ ($n_2$=1.46), and the light-emitting layer 4 is configured to emit blue light (λ=450 nm), the thicknesses $d_1$ and $d_2$ are as follows.

$$d_1 = 53 \text{ nm}$$

$$d_2 = 77 \text{ nm}$$

The p-side pad electrode 10 electrically connects the wiring (not shown) formed on the printed board PB to the p-side electrode 8. Further, the p-side pad electrode 10 is electrically connected to an upper surface of the p-type semiconductor layer 5 via the p-side electrode 8. The p-side pad electrode 10 has a metal laminated structure of Ti/Au and Au/Sn having a thickness of about 500 nm to about 3000 nm. The p-side pad electrode 10 is formed to cover a half or more than the half of an upper surface 9b of the reflecting layer 9 and to bury the opening 9a. A connection surface (corresponding to a second connection surface in claim 1) 10a that is a lower surface of the p-side pad electrode 10 is electrically connected to the p-type semiconductor layer 5 via the p-side electrode 8. The connection surface 10a is formed in the opening 9a of the reflecting layer 9 and formed into a long rectangular shape along the short side 2b of the substrate 2. The connection surface 10a is formed to be arranged in the fourth area Ar4 closest to the short side 2b on an arrow A direction-side. The connection surface 10a of the p-side pad electrode 10 is thereby formed on an opposite side to the connection surface 7a of the n-side pad 7 across a center line CL of the substrate 2 in parallel to the short side 2b of the substrate 2 of the semiconductor light-emitting device 1.

In a plan view, an n-side pad electrode 7-side side 10b among four sides of the rectangular connection surface 10a of the p-side pad electrode 10 and a p-side pad electrode 10-side side 7b among four sides of the rectangular connection surface 7a of the n-side pad electrode 7 are formed to be parallel to each other. The p-side pad electrode 10 and the n-side pad electrode 7 are formed so that a height from an upper surface 2c of the substrate 2 to an upper surface of the p-side pad electrode 10 and a height from the upper surface 2c of the substrate 2 to an upper surface 7c of the n-side pad electrode 7 are equally "H". Further, the p-side pad electrode 10 and the n-side pad electrode 7 are configured so that the shortest distance between the p-side pad electrode 10 and the n-side pad electrode 7 is about 30 μm, preferably about 50 μm.

An operation of the semiconductor light-emitting device 1 according to the first embodiment stated above is explained next.

First, when a forward voltage is applied between the n-side pad electrode 7 and the p-side pad electrode 10, electrons are then injected into the n-side pad electrode 7, and holes are injected into the n-side pad electrode 10. The electrons injected into the n-side pad electrode 7 are injected from the connection surface 7a formed in the first area Ar1 into the light-emitting layer 4 via the n-side electrode 6 and the n-type semiconductor layer 3. The holes injected into the p-side pad electrode 10 are injected from the connection surface 10a formed in the first area Ar1 into the light-emitting layer 4 via the p-side electrode 8 and the p-type semiconductor layer 5. In the present embodiment, a path of current that is a flow of electrons and holes is wide since a distance between the connection surfaces 7a and 10a is long. The electrons and holes injected into the light-emitting layer 4 recombine in the well layers 21, thereby emitting the blue light L of about 450 nm. In the present embodiment, because of the wide current path, a region of the well layers 21 contributing to light emission is large and an amount of emitted light is large.

The light L traveling toward the substrate 2 out of the lights L emitted from the light-emitting layer 4 transmits through the n-type semiconductor layer 3 and the substrate 2 and is irradiated to the outside. The light traveling toward the p-side electrode 8 out of the lights L emitted from the light-emitting layer 4 is hardly absorbed but transmits through the p-type semiconductor layer 5 and the p-side electrode 8, and then reaches the reflecting layer 9. After being reflected by the reflecting layer 9, the light L reaching the reflecting layer 9 transmits through the p-side electrode 8 to the substrate 2 and is irradiated to the outside.

A method of manufacturing the semiconductor light-emitting device 1 according to the first embodiment stated above is explained next with reference to the drawings. FIGS. 5 to 11 are cross-sectional views of the semiconductor light-emitting device in respective manufacturing steps.

Figure 5:
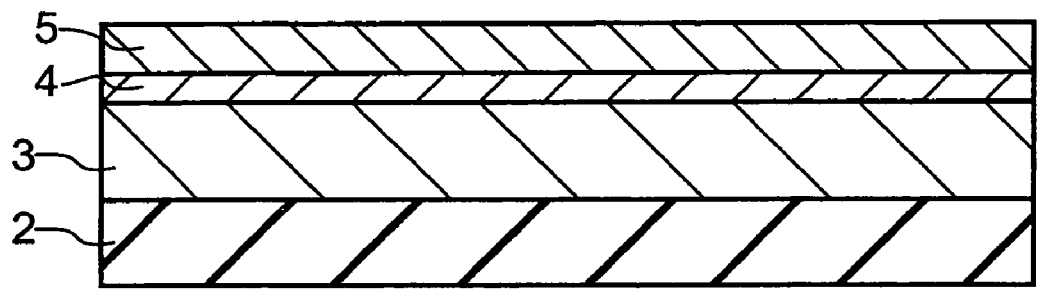
FIG. 5 A cross-sectional view of the semiconductor light-emitting device in respective manufacturing steps.

First, the substrate 2 constituted by a sapphire substrate is introduced into an MOCVD device (not shown) and a growth temperature is set to about 1050° C. In this state, as shown in FIG. 5, silane gas, trimethylgallium (hereinafter, TMG) gas, and ammonium gas are supplied using carrier gas, thereby forming the n-type semiconductor layer 3 made of n-type GaN doped with Si on the substrate 2.

Next, in a state of setting the growth temperature to about 760° C., trimethylindium (hereinafter, TMI) gas, the TMG gas, and the ammonium gas are supplied using carrier gas, thereby forming the well layer 21 made of undoped InGaN on the n-type semiconductor layer 3. In a state of keeping the growth temperature to about 760° C., the TMG gas and the ammonium gas are supplied using carrier gas, thereby forming the barrier layer 22 made of undoped GaN on the well layer 21. Thereafter, a plurality of well layers 21 and a plurality of barrier layers 22 are alternately stacked under the same conditions, thereby forming the light-emitting layer 4.

Next, in a state of setting the growth temperature to about 1010° C., bis(cyclopentadienyl)magnesium ($Cp_2Mg$) gas, the TMG gas, and the ammonium gas are supplied, thereby forming the p-type semiconductor layer 5 made of p-type GaN doped with Mg on the light-emitting layer 4.

Figure 6:
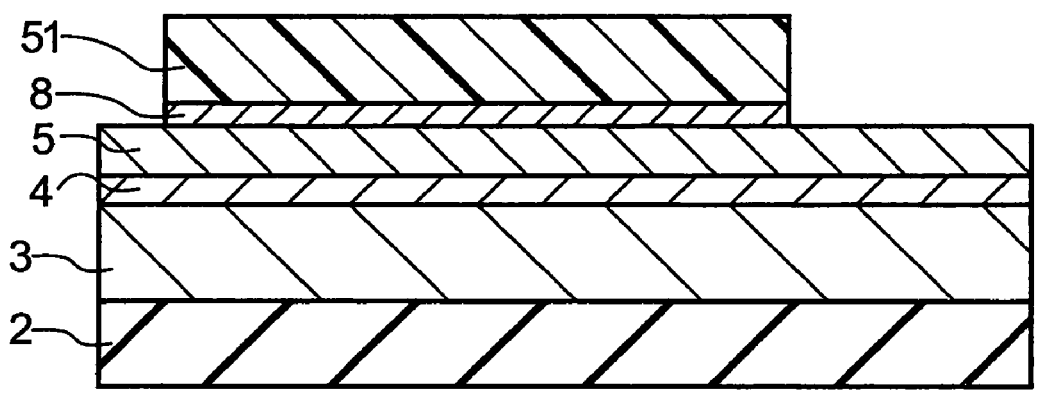
FIG. 6 A cross-sectional view of the semiconductor light-emitting device in respective manufacturing steps.

Next, in a state of setting the growth temperature to a room temperature to about 900° C., a ZnO film is formed on the p-type semiconductor layer 5 by a sputtering method or the like. Thereafter, as shown in FIG. 6, in a state where a resist film 51 is formed into a desired pattern, the ZnO film is etched, thereby patterning the p-side electrode 8.

Figure 7:
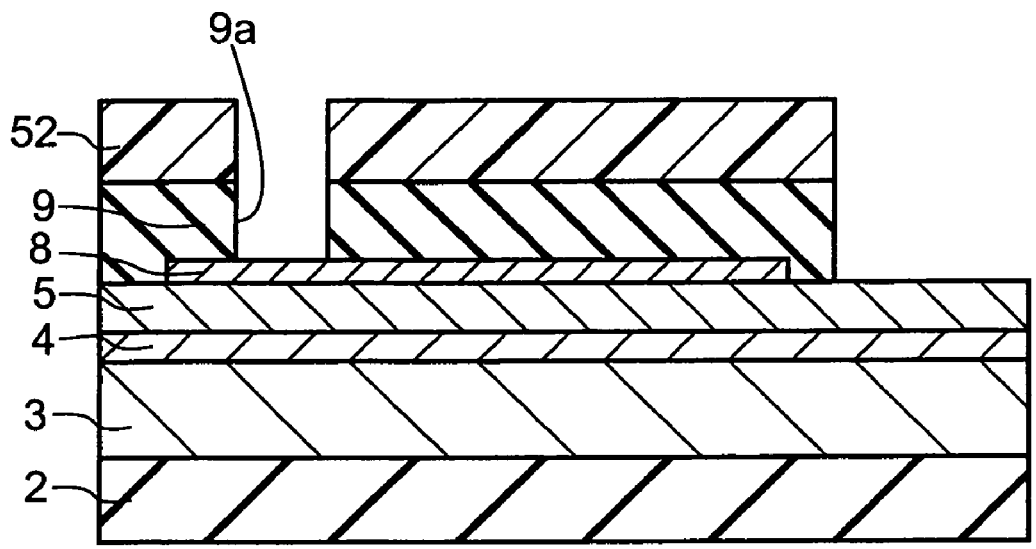
FIG. 7 A cross-sectional view of the semiconductor light-emitting device in respective manufacturing steps.

Next, in a state of setting the growth temperature to about 100° C. to about 300° C., the first dielectric layers 23 made of $ZrO_2$ and the second dielectric layers 24 made of $SiO_2$ are alternately stacked by a method such as sputtering. Thereafter, as shown in FIG. 7, in a state of forming a resist film 52 into a desired pattern, the first dielectric layers 23 and the second dielectric layers 24 are etched, thereby forming the opening 9a in the reflecting layer 9, and a resultant structure is patterned so as to expose a part of the p-type semiconductor layer 5.

Figure 8:
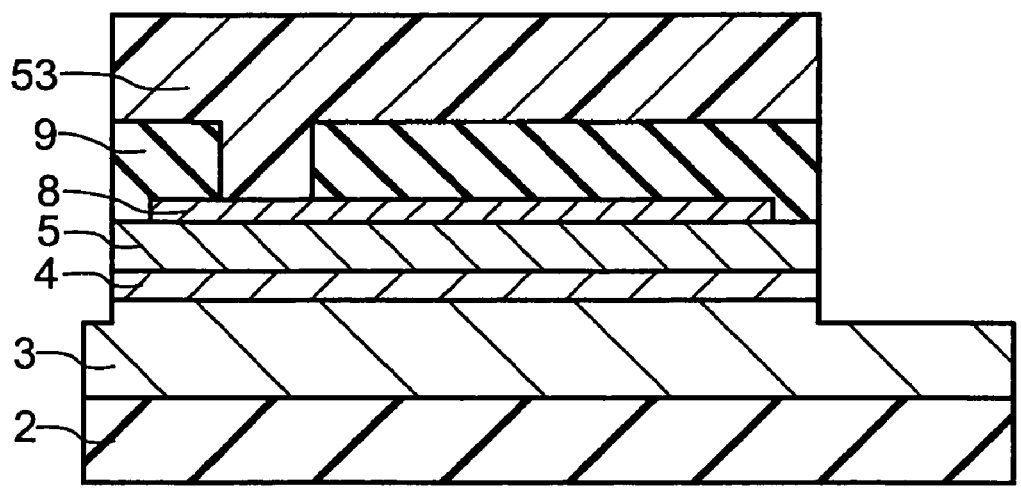
FIG. 8 A cross-sectional view of the semiconductor light-emitting device in respective manufacturing steps.

Next, as shown in FIG. 8, after forming a resist film 53 into a desired pattern, the reflecting layer 9 to the n-type semiconductor layer 3 are etched, thereby patterning a resultant structure into a mesa-type structure.

Figure 9:
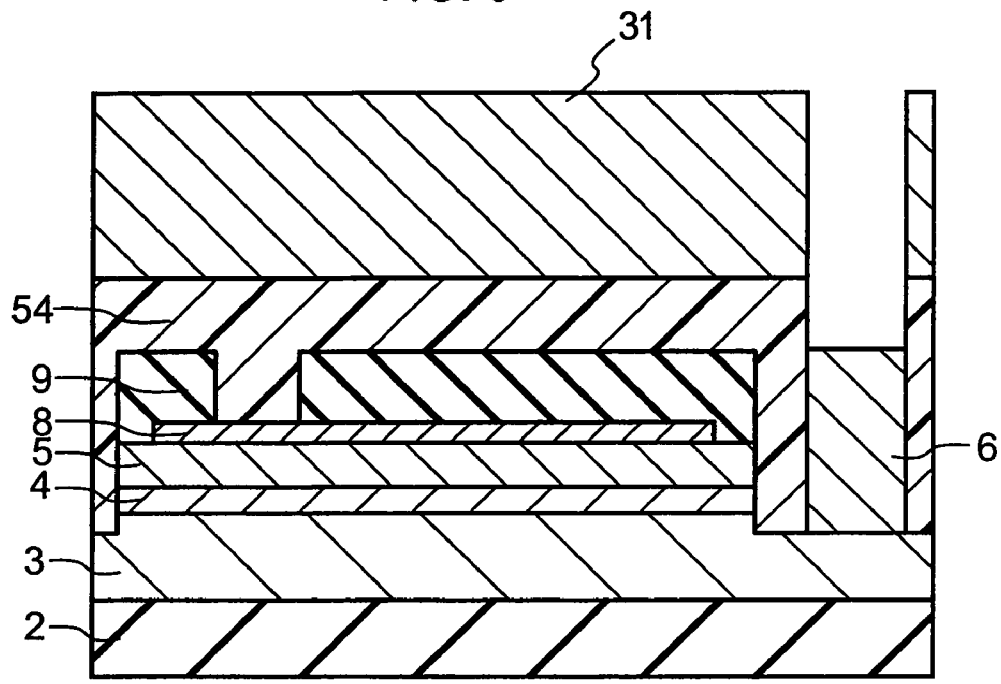
FIG. 9 A cross-sectional view of the semiconductor light-emitting device in respective manufacturing steps.

Next, as shown in FIG. 9, after forming a resist film 54 so as to expose a part of the n-type semiconductor layer 3, the n-side electrode 6 made of Al/Ni is formed by a vapor-deposition method or the like. Thereafter, an Al/Ni film 31 on the resist film 54 as well as the resist film 54 is removed.

Figure 10:
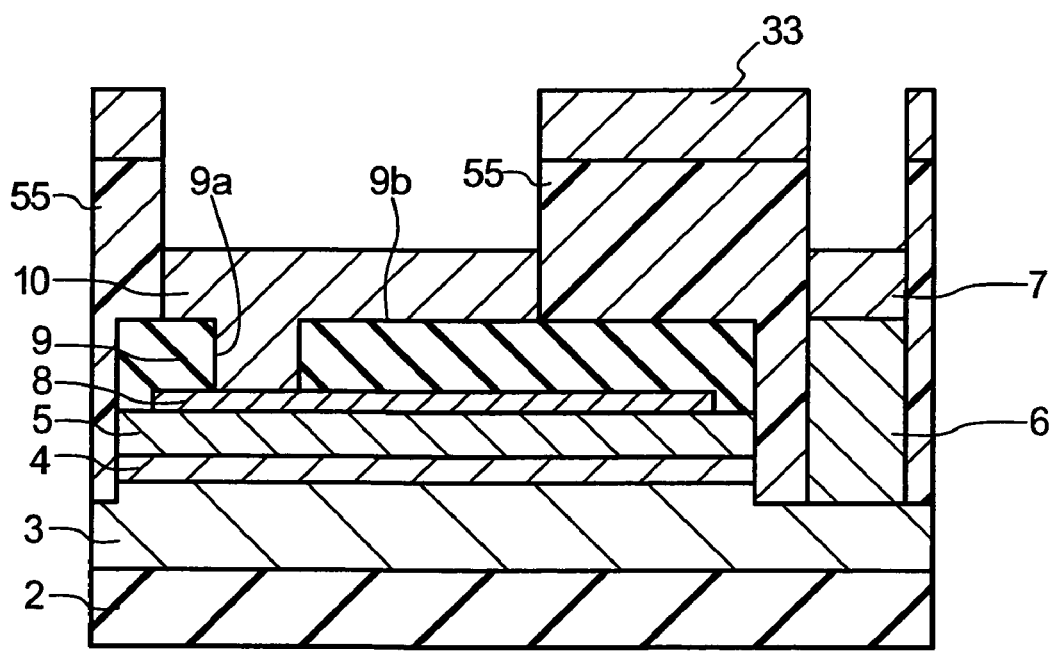
FIG. 10 A cross-sectional view of the semiconductor light-emitting device in respective manufacturing steps.
Figure 11:
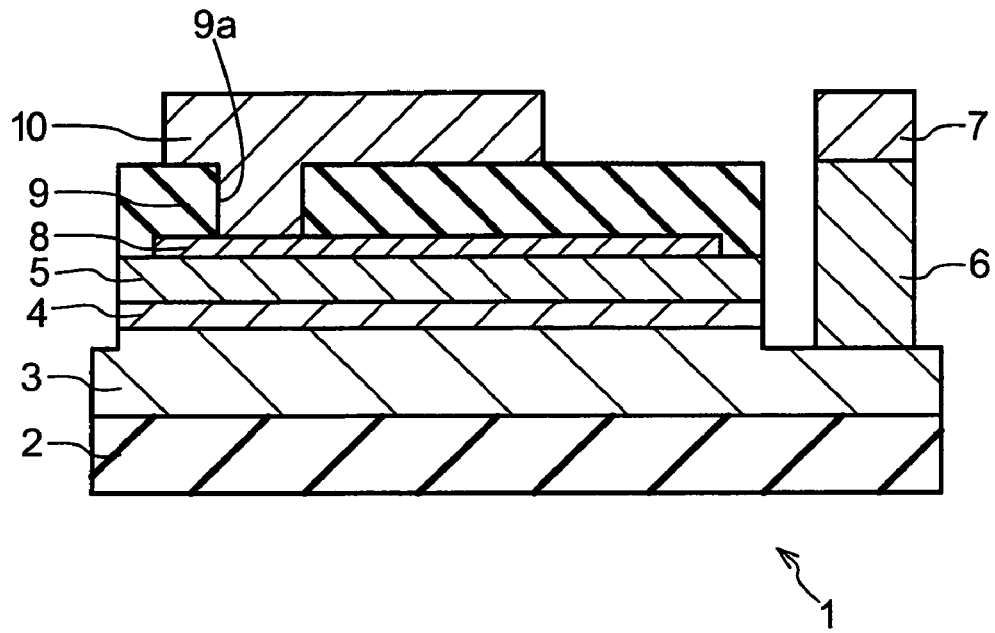
FIG. 11 A cross-sectional view of the semiconductor light-emitting device in respective manufacturing steps.

Next, as shown in FIG. 10, after forming a resist film 55 so as to expose a part of an upper surface of the n-side electrode 6 and the opening 9a and upper surface 9b of the reflecting layer 9, the n-side pad electrode 7 and the p-side pad electrode 10 each having the laminated structure of Ti/Au and Au/Sn are formed by the vapor-evaporation method or the like. Thereafter, as shown in FIGS. 10 and 11, a Ti/Au and Au/Sn film 33 on the resist film 55 is removed, thereby completing the semiconductor light-emitting device 1. Finally, as shown in FIG. 1, the upper surface 7c of the n-side pad electrode 7 and an upper surface 10c of the p-side pad electrode 10 are electrically connected to the wiring of the printed board PB.

As described above, in the semiconductor light-emitting device 1 according to the first embodiment, the n-side pad electrode 7 and the p-side pad electrode 10 are formed so that the connection surface 7a of the n-side pad electrode 7 is located on the opposite side to the connection surface 10a of the p-side pad electrode 10 across the center line CL of the substrate 2. Furthermore, the connection surface 7a is arranged in the first area Ar1 and the connection surface 10a is arranged in the fourth area Ar4, whereby the distance between the connection surfaces 7a and 10a can be made long. It is thereby possible to the path of current flowing between the n-side pad electrode 7 and the p-side pad electrode 10 ca be made wide. As a result, the region of the light-emitting layer contributing to light emission can be made large and therefore the amount of light irradiated to the outside can be increased.

Furthermore, in the semiconductor light-emitting device 1, the height from the upper surface 2c of the substrate 2 to the upper surface 7c of the n-side pad electrode 7 and the height from the upper surface 2c of the substrate 2 to the upper surface 10c of the p-side pad electrode 10 are equally set to "H". It is thereby possible to easily make the semiconductor light-emitting device 1 and the printed board PB on the level when the both upper surfaces 7c and 10c are connected to the printed board PB. It is thereby possible to easily make directions of irradiated lights uniform even when a plurality of semiconductor light-emitting devices 1 is connected onto the printed board PB.

Further, in the semiconductor light-emitting device 1, the n-side pad electrode 7 and the p-side pad electrode 10 are configured so that one side 7b of the connection surface 7a of the n-side pad electrode 7 is in parallel to one side 10b of the connection surface 10a of the p-side pad electrode 10. Therefore, it is possible to suppress irregularities in the current flowing in the light-emitting layer 4. It is thereby possible to suppress irregularities in the amount of light emitted from the light-emitting layer 4, and therefore possible to suppress unevenness in the irradiated light.

Moreover, in the semiconductor light-emitting device 1, each of the connection surface 7a of the n-side pad electrode 7 and the connection surface 10a of the p-side pad electrode 10 is formed into a rectangular shape long along the direction of the short side 2b of the substrate 2, thereby making the current path wider.

Furthermore, in the semiconductor light-emitting device 1, each long side 2a of the substrate 2 is set 2.0±0.3 times, that is, about twice as long as the short side 2b thereof, and two semiconductor light-emitting devices 1 are arranged so that the long sides 2a of the two semiconductor light-emitting devices 1 contact each other, thereby making it possible to provide a square light-emitting device including the two semiconductor light-emitting devices 1. Note that such a light-emitting device can be applied to an instance of arranging two semiconductor light-emitting devices 1 emitting different lights, respectively or the like.

Further, in the semiconductor light-emitting device 1 according to the first embodiment, the p-side electrode 8 is constituted by ZnO that is conductive and light-transmittable. Therefore, the light absorbed by an interface between the p-side electrode 8 and the p-type semiconductor layer 5 can be reduced. By doing so, even when the light L emitted from the light-emitting layer 4 travels toward the p-side electrode 8, a large amount of the light L can transmit through the reflecting layer 9 and extracted to the outside. Therefore, light extraction efficiency can be improved.

Moreover, in the semiconductor light-emitting device 1, not only the upper surface of the p-side electrode 8 made of ZnO that tends to cause a chemical reaction but also the side surface thereof is covered with the reflecting layer 9. It is thereby possible to suppress deterioration in the p-side electrode 8 by etchant or the like.

Second Embodiment

Figure 12:
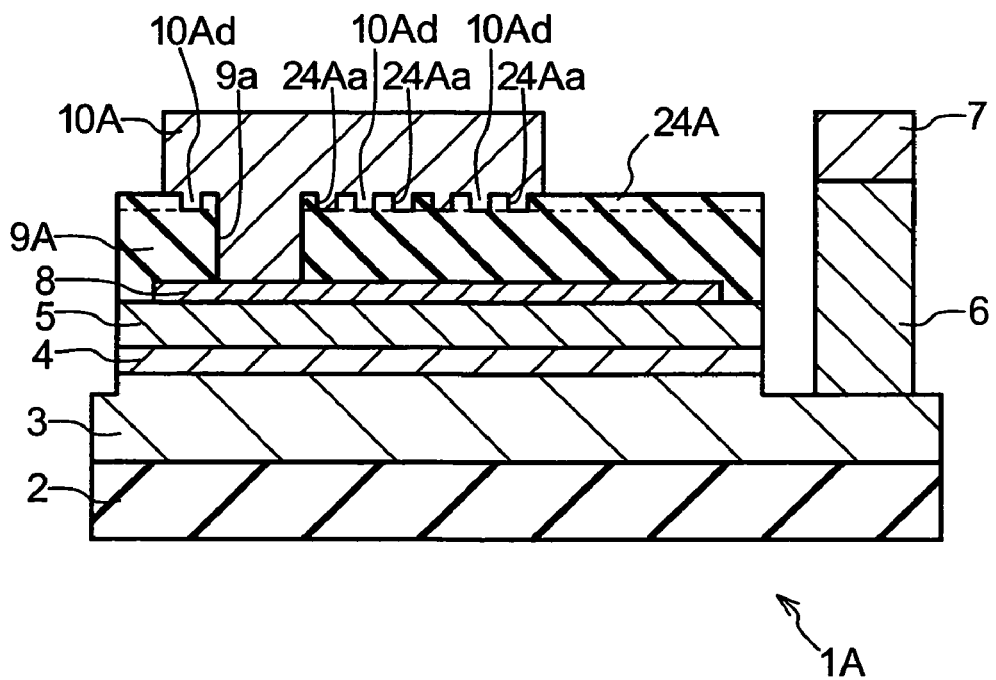
FIG. 12 A cross-sectional view of a semiconductor light-emitting device according to a second embodiment.

A second embodiment, which is a partial modification of the first embodiment described above, is explained next with reference to the drawings. FIG. 12 is a cross-sectional view of a semiconductor light-emitting device according to the second embodiment. FIG. 13 is a plan view of the semiconductor light-emitting device according to the second embodiment.

As shown in FIGS. 12 and 13, a semiconductor light-emitting device 1A according to the second embodiment is configured so that a reflecting layer 9A and a p-side pad electrode 10A differ from those according to the first embodiment. An uppermost second dielectric layer 24A is formed to have a thickness of about 500 nm to about 3000 nm larger than a thickness (about 77 nm) of a lower second dielectric layer 24 (see FIG. 4). A plurality of concave portions 24Aa is formed in the second dielectric layer 24A by etching. Each of the concave portions 24Aa is formed into a square having a side of 5 μm in a plan view. Parts 10Ad of a lower surface of an upper portion of the p-side pad electrode 10A are buried in the concave portions 24Aa.

Steps of manufacturing the semiconductor light-emitting device 1A are explained next. FIG. 14 is a cross-sectional view for explaining the steps of manufacturing the semiconductor light-emitting device according to the second embodiment.

After the step shown in FIG. 7 according to the first embodiment, a resist film 56 is formed into a pattern corresponding to the concave portions 24Aa as shown in FIG. 14. Thereafter, the second dielectric layer 24A of the reflecting layer 9A is etched, thereby forming a plurality of concave portions 24Aa. Subsequently, steps substantially identical to the steps shown in FIG. 8 onwards according to the first embodiment are performed.

As described above, a plurality of concave portions 24Aa is formed in the uppermost second dielectric layer 24A of the reflecting layer 9 and the parts 10Ad of the lower surface of the upper portion of the p-side pad electrode 10A are buried in the concave portions 24Aa, thereby making it possible to increase a contact area between the second dielectric layer 24A and the p-side pad electrode 10A. It is thereby possible to improve adhesiveness between the second dielectric layer 24A and the p-side pad electrode 10A that tend to separate from each other. Further, by making the upper surface of the second dielectric layer 24A and the lower surface of the upper portion of the p-side pad electrode 10A into an engagement structure, it is possible to provide a structure strong against an external force from a horizontal direction.

Third Embodiment

Figure 15:
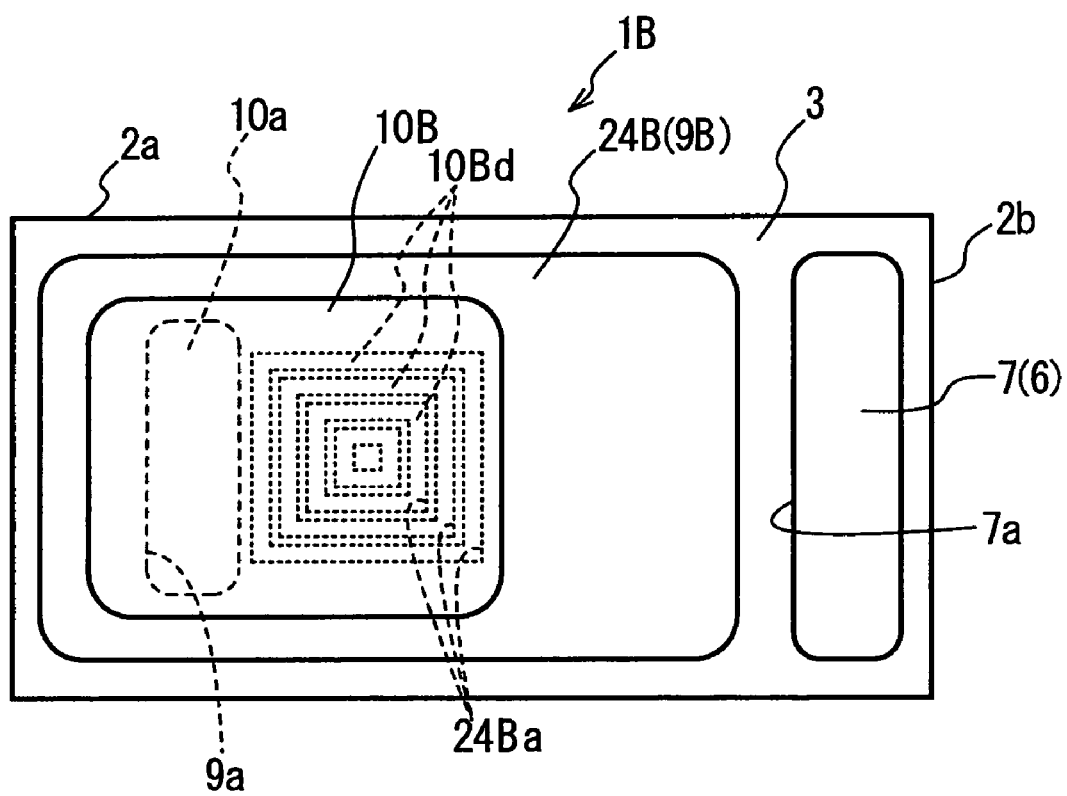
FIG. 15 A plan view of a semiconductor light-emitting device according to a third embodiment.

A third embodiment, which is a partial modification of the second embodiment described above, is explained next. FIG. 15 is a plan view of a semiconductor light-emitting device according to the third embodiment.

As shown in FIG. 15, in a semiconductor light-emitting device 1B according to the third embodiment, concave portions 24Ba are formed in an uppermost second dielectric layer 24B of a reflecting layer 9B. Note that the concave portions 24Ba are formed into four grooves, respectively along sides of a plurality of squares. Parts 10Bd of a lower surface of an upper portion of a p-side pad electrode 10B are buried in the concave portions 24Ba.

As described above, in the semiconductor light-emitting device 1B according to the third embodiment, the four concave portions 24Ba are formed in the uppermost second dielectric layer 24B of the reflecting layer 9B and the parts 10Bd of the lower surface of the upper portion of the p-side pad electrode 10B are buried in the concave portions 24Ba. Therefore, the third embodiment can exhibit effects identical to those of the second embodiment.

While embodiments of the present invention have been described above, the invention is not limited to the embodiments described in this specification. The scope of the invention is defined by the descriptions of the appended claims and by the equivalent range of the claims. A modification mode, which is a partial modification of the above embodiments, is described below.

For example, the connection surface of the n-side pad electrode can be formed in a second region and the connection surface of the p-side pad electrode can be formed in a third region.

Furthermore, the height from the upper surface of the substrate to the upper surface of the n-side pad electrode can be set different from the height from the upper surface of the substrate to the upper surface of the p-side pad electrode.

Further, each of the connection surfaces of the n-side pad electrode and p-side pad electrode can be formed into a shape other than a rectangular shape.

Moreover, the shape of the substrate in a plan view can be appropriately changed and the substrate can be formed into a shape other than a rectangular shape.

Furthermore, materials constituting the respective layers can be appropriately changed. For example, as the dielectric constituting the reflecting layer, examples of the material other than the above-mentioned material include $TiO_2$ and $Al_2O_3$. Further, as the conductive and light-transmittable oxide material constituting the p-side electrode, examples of the material include ITO and IZO.

Further, thicknesses and shapes of the respective layers described above can be appropriately changed.

Moreover, a wavelength of the light emitted from the light-emitting layer can be appropriately changed. For example, by changing an In ratio X in $In_xGa_{1-x}N$ constituting the well layers, green light ($0.2 \leq X \leq 0.5$) can be emitted. In addition, a plurality of well layers can be constituted by $In_xGa_{1-x}N$ having different In ratios X.

Furthermore, the material constituting the substrate is not limited to sapphire but can be any material as long as the material can transmit light from the light-emitting layer. Examples of the material that constitute a substrate and satisfy such a condition include ZnO, SiC, and GaP.

INDUSTRIAL APPLICABILITY

According to the present invention, since the first connection surface is formed on the opposite side to the second connection surface across the center line of the substrate, it is possible to make a path of current flowing between the first pad electrode and the second pad electrode wide. Since it is thereby possible to make the region of the light-emitting layer contributing to light emission large, the amount of light irradiated to the outside can be increased.

Furthermore, according to the present invention, the transparent electrode made of an oxide is formed between the second conduction-type semiconductor layer and the reflecting layer. Accordingly, the light emitted from the light-emitting layer, transmitting through the second conduction-type semiconductor layer, and reaching the transparent electrode is hardly absorbed but reaches the reflecting layer. Because a large amount of light can be thereby reflected by the reflecting layer and irradiated to the outside, light extraction efficiency can be improved.

The invention claimed is:

1. A semiconductor light-emitting device, comprising:
   a substrate having long sides and short sides defining a rectangular shape in a plan view, and having first and second center lines that are respectively parallel to the short and long sides in the plan view;
   a semiconductor layer including a first conduction-type semiconductor layer, a light-emitting layer, and a second conduction-type semiconductor layer, and formed on the substrate;
   a first pad electrode electrically connected to an upper surface of the first conduction-type semiconductor layer; and
   a second pad electrode electrically connected to an upper surface of the second conduction-type semiconductor layer, wherein
   a first connection surface of the first pad electrode, located on one side of said first center line of the substrate, is electrically connected to the first conduction-type semiconductor layer, a second connection surface of the second pad electrode, located on a side of said first center line opposite to said one side, being electrically connected to the second conduction-type semiconductor layer,
   the first connection surface of the first pad electrode and the second connection surface of the second pad electrode are rectangular with longer sides extending in the direction of the short sides of the substrate in a plan view,
   the second pad electrode has a rectangular first surface, defined by long and short sides and having a first area, as measured in the plan view of the substrate, and the second connection surface has a second area as measured in the plan view, that is smaller than the first area, the long sides of said first surface extending in the same direction as the long sides of the substrate and across said first center line, and the short sides of said first surface extending in the same direction as the short sides of the substrate and across said second center line, and a printed board is mounted on the first surface of the second pad electrode.

2. The semiconductor light-emitting device according to claim 1, wherein a height from an upper surface of the substrate to an upper surface of the first pad electrode is equal to a height from the upper surface of the substrate to an upper surface of the second pad electrode.

3. The semiconductor light-emitting device according to claim 1, wherein one side of the first connection surface on the second pad electrode-side is parallel to one side of the second connection surface on the first pad electrode-side.

4. The semiconductor light-emitting device according to claim 1, wherein, among a first region to a fourth region formed by equally dividing the substrate along a long side direction, the first connection surface is located in the first region closest to one of the short sides of the substrate and the second connection surface is located in the fourth region closest to the other short side of the substrate.

5. The semiconductor light-emitting device according to claim 1, wherein a length of each of long sides of the substrate is 1.7 to 2.3 times as large as a length of each of the short sides of the substrate.

6. The semiconductor light-emitting device according to claim 1, comprising:
a transparent electrode formed on the second conduction-type semiconductor layer and made of a conductive oxide; and
a reflecting layer including a dielectric multilayer film formed on the transparent electrode so as to expose a part of the transparent electrode, wherein
the first conduction-type semiconductor layer is formed on the substrate,
the light-emitting layer is formed on the first conduction-type semiconductor layer,
the second conduction-type semiconductor layer is formed on the light-emitting layer, and
the second pad electrode is formed on the reflecting layer while being electrically connected to a part of the transparent electrode.

7. The semiconductor light-emitting device according to claim 6, wherein a concave portion is formed in an uppermost layer in the reflecting layer, and a part of the second pad electrode is buried in the concave portion.

8. The semiconductor light-emitting device according to claim 6, wherein the reflecting layer is formed to cover a side surface of the transparent electrode.

9. The semiconductor light-emitting device according to claim 6, wherein the substrate can transmit light from the light-emitting layer.

10. The semiconductor light-emitting device according to claim 1, wherein the second connection surface has a first portion as identified in said plan view, and the second pad electrode has a second portion as identified in said plan view, that includes the entire first portion.

11. The semiconductor light-emitting device according to claim 1, comprising:
a reflecting layer formed on the second conduction-type semiconductor layer, wherein the second pad electrode is electrically connected to the upper surface of the second conduction-type semiconductor layer through a concave portion formed in the reflecting layer, and
the second pad electrode covers the entire area of the concave portion.

12. The semiconductor light-emitting device according to claim 1, further comprising a reflecting layer including a dielectric multilayer film formed on the second conduction-type semiconductor layer, wherein the second pad electrode is formed to cover half or more of an upper surface area of the reflecting layer.

13. A semiconductor light-emitting device, comprising:
a substrate having long sides and short sides defining a rectangular shape in a plan view, and having first and second center lines that are respectively parallel to the short and long sides in the plan view;
a semiconductor layer including a first conduction-type semiconductor layer formed on the substrate, a light-emitting layer formed on the first conduction-type semiconductor layer and made of a GaN-based semiconductor, and a second conduction-type semiconductor layer formed on the light-emitting layer;
a transparent electrode formed on the second conduction-type semiconductor layer, and made of a conductive oxide;
a reflecting layer including a dielectric multilayer film formed on the transparent electrode so as to expose a part of the transparent electrode; and
an upper electrode formed on the reflecting layer while being electrically connected to a part of the transparent electrode, wherein
a connection surface of the upper electrode is connected to the transparent electrode,
the upper electrode has a rectangular first surface, defined by long and short sides and having a first area, as measured in the plan view of the substrate, and the connection surface has a second area as measured in the plan view, that is smaller than the first area, the long sides of said first surface extending in the same direction as the long sides of the substrate and across a first center line of the substrate, said first center line being parallel to short sides of the substrate in the plan view, and the short sides of said first surface extending in the same direction as the short sides of the substrate and across said second center line of the substrate, and
a printed board is mounted on the first surface of the upper electrode.

14. The semiconductor light-emitting device according to claim 13, wherein a concave portion is formed in an uppermost layer in the reflecting layer, and a part of the upper electrode is buried in the concave portion.

15. The semiconductor light-emitting device according to claim 13, wherein the reflecting layer is formed to cover a side surface of the transparent electrode.

16. The semiconductor light-emitting device according to claim 13, wherein the substrate can transmit light from the light-emitting layer.

17. The semiconductor light-emitting device according to claim 13, wherein the connection surface has a first portion as identified in said plan view, and the upper electrode has a second portion as identified in said plan view, that includes the entire first portion.

18. The semiconductor light-emitting device according to claim 13, wherein
the reflecting layer includes a concave portion, and
the upper electrode covers the entire area of the concave portion.

19. The semiconductor light-emitting device according to claim 13, wherein the upper electrode is formed to cover half or more of an upper surface area of the reflecting layer.

* * * * *